United States Patent [19]
He et al.

[11] Patent Number: 6,020,238
[45] Date of Patent: Feb. 1, 2000

[54] METHOD OF FABRICATING A HIGH DIELECTRIC CONSTANT INTERPOLYSILICON DIELECTRIC STRUCTURE FOR A LOW VOLTAGE NON-VOLATILE MEMORY

[75] Inventors: Yue-Song He, San Jose; Effiong Ibok, Sunnyvale, both of Calif.

[73] Assignee: Advanced Micro Devices, Inc., Sunnyvale, Calif.

[21] Appl. No.: 08/978,107

[22] Filed: Nov. 25, 1997

[51] Int. Cl.⁷ .................................. H01L 21/8247
[52] U.S. Cl. .................................................. 438/261
[58] Field of Search ........................ 438/257–267

[56] References Cited

U.S. PATENT DOCUMENTS

| | | |
|---|---|---|
| 4,360,900 | 11/1982 | Bate . |
| 5,060,034 | 10/1991 | Shimizu et al. . |
| 5,304,829 | 4/1994 | Mori et al. ............................. 257/324 |
| 5,371,028 | 12/1994 | Koh . |
| 5,536,667 | 7/1996 | Cho . |
| 5,619,051 | 4/1997 | Endo ...................................... 257/316 |
| 5,661,056 | 8/1997 | Takeuchi ................................ 438/261 |
| 5,888,870 | 3/1999 | Gardner et al. ....................... 438/261 |

*Primary Examiner*—Richard Booth
*Attorney, Agent, or Firm*—Fliesler, Dubb, Meyer & Lovejoy

[57] ABSTRACT

A method of fabricating an interpolysilicon dielectric structure in a non-volatile memory includes the steps of forming a nitride layer 12 on a floating gate 10 and a high dielectric constant layer 14 on the nitride layer 12. A control gate 18 may be formed directly on the high dielectric constant layer 14, or on a thin layer 16 of an oxide or an oxynitride on the high dielectric constant layer 14.

76 Claims, 4 Drawing Sheets

METHOD OF FABRICATING A HIGH DIELECTRIC CONSTANT INTERPOLYSILICON DIELECTRIC STRUCTURE FOR A LOW VOLTAGE NON-VOLATILE MEMORY

TECHNICAL FIELD

The present invention relates to a method of fabricating a dielectric structure in a non-volatile memory, and more particularly, to a method of fabricating a dielectric structure between floating and control gates in the non-volatile memory.

BACKGROUND ART

Non-volatile memories have been developed by the semiconductor integrated circuit industry for computer applications. Examples of non-volatile memory devices include conventional flash electronically erasable programmable read-only memories (EEPROMs). A typical non-volatile memory device is a dual gate device with a gate structure that generally includes a thin tunnel oxide layer between a source and a drain on a substrate, a polysilicon floating gate on the tunnel oxide layer, a dielectric stack on the floating gate, and a polysilicon control gate on the dielectric stack. The floating gate and the control gate, which are separated by the interpolysilicon dielectric stack, form a capacitor with a capacitance which is approximately directly proportional to the dielectric constant of the dielectric stack and approximately inversely proportional to the thickness of the dielectric stack.

During the operation of the non-volatile memory, a program or erase voltage is applied to the control gate, depending upon whether the presence of a voltage at the control gate signifies a program or erase. A voltage at the floating gate is induced by the voltage at the control gate through the capacitor formed by the dielectric stack between the floating and control gates. The ratio of the voltage induced at the floating gate to the voltage applied to the control gate is called the coupling ratio of the non-volatile memory. A conventional non-volatile memory device, for example, a NAND flash memory device, typically requires an operating voltage on the order of about 20 volts applied to the control gate to induce a sufficient voltage at the floating gate because the conventional device usually has a relatively small coupling ratio typically on the order of about 50%.

An example of a conventional interpolysilicon dielectric stack is a three-layer stack comprising a nitride layer sandwiched by two oxide layers. In general, conventional oxide and nitride materials have small dielectric constants although a nitride dielectric typically has a dielectric constant greater than that of an oxide dielectric. In a conventional non-volatile dual gate memory employing an oxide-nitride-oxide (ONO) dielectric stack as the interpolysilicon structure between the floating and control gates, the coupling ratio can be as low as 50% because of the low dielectric constants of the oxide and nitride layers. The coupling ratio of the non-volatile memory device is largely dependent upon the capacitance of the capacitor formed by the floating and control gates separated by the interpolysilicon dielectric stack. Although the capacitance and therefore the coupling ratio can be increased by decreasing the thickness of the ONO dielectric stack, the minimum thickness of the ONO dielectric stack is limited by existing processing technology. A very thin ONO dielectric stack usually has a poor data retention resulting in a low yield. A thick dielectric stack would improve the yield of the non-volatile memory devices, but it would decrease the coupling ratio, thereby necessitating a corresponding increase in the operating voltage, which is the program or erase voltage applied to the control gate. A high program or erase voltage at the control gate may be undesirable in that it may require an upconverted voltage power supply.

Therefore, there is a need for an interpolysilicon dielectric structure between the polysilicon floating and control gates with a large capacitance and therefore a large coupling ratio, to obviate the need for a high program or erase voltage to be applied to the control gate. Furthermore, there is a need for a method of fabricating a low voltage non-volatile memory device with a high yield.

DISCLOSURE OF THE INVENTION

The present invention satisfies these needs. In accordance with the present invention, a method of fabricating a dielectric structure in a non-volatile memory generally comprises the steps of:

(a) providing a first polysilicon layer as a floating gate;

(b) forming a nitride layer on the first polysilicon layer; and (c) forming a high dielectric constant layer on the nitride layer.

A second polysilicon layer can be formed on the high dielectric constant layer to serve as a control gate. The high dielectric constant layer may be made of tantalum oxide ($Ta_2O_5$), titanium oxide ($TiO_2$) or other appropriate high dielectric constant materials. In an embodiment, the step of forming a nitride layer on the first polysilicon layer includes the step of depositing a thin layer of nitride on the first polysilicon layer by using techniques such as a chemical vapor deposition. In another embodiment, the nitride layer may be formed on the first polysilicon layer by nitridizing the surface portion of the first polysilicon layer with ammonium ($NH_3$). For example, the first polysilicon layer may receive a plasma $NH_3$ nitridation in a plasma $NH_3$ ambient. In yet another embodiment, a thin layer of oxynitride may be deposited on the first polysilicon layer prior to the step of forming the high dielectric constant layer.

The high dielectric constant layer can be deposited on the nitride layer and heated to remove any carbon content from the high dielectric constant layer. For example, the high dielectric constant layer may be annealed in a nitrogen oxide ($N_2O$ or $NO$) ambient to form a nitrogen-rich oxide layer on the high dielectric constant layer. The second polysilicon layer can be subsequently formed on the high dielectric constant layer to serve as the control gate.

Advantageously, the present invention provides a method of fabricating a dielectric structure with a high dielectric constant to improve the coupling ratio over that which can be achieved by conventional interpolysilicon dielectric structures, thereby obviating the need for a high program or erase voltage to be applied to the control gate. Another advantage of the invention is that it allows a relatively thick dielectric structure to be produced between the floating and control gates while maintaining a large capacitance which results in a high coupling ratio, thereby enabling the low voltage non-volatile memory to be fabricated with a high yield.

BRIEF DESCRIPTION OF THE DRAWINGS

The present invention will be described with respect to particular embodiments thereof, and references will be made to the drawings in which.

MODES FOR CARRYING OUT THE INVENTION

The present invention provides a method of making an interpolysilicon dielectric structure in a non-volatile memory that is able to provide a large capacitance and therefore a high coupling ratio to allow the memory to be operated with low program or erase voltages. Moreover, the method according to the present invention allows the dielectric structure to be fabricated with a greater thickness than that of a conventional interpolysilicon dielectric structure while still providing a high coupling ratio, thereby allowing the low voltage non-volatile memory to be produced with a high yield.

Figure 1:
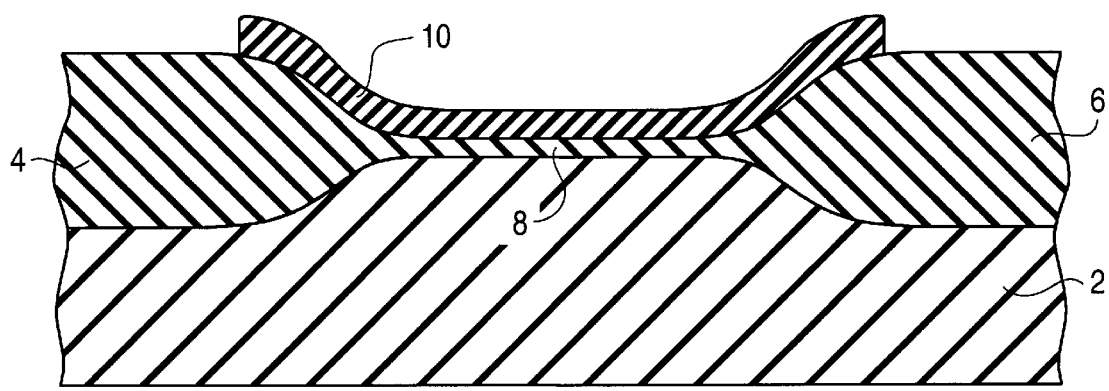
FIG. 1 is a sectional view of a portion of a non-volatile memory device with a floating gate on a tunnel oxide.

FIG. 1 is a sectional view of a partially fabricated non-volatile memory device with a silicon substrate 2, a field oxide layer with first and second portions 4 and 6 connected by a thin layer of tunnel oxide 8 on the substrate 2, and a first polysilicon layer 10, which serves as a floating gate for the non-volatile memory. The field oxide portions 4, 6 and the tunnel oxide 8 comprise silicon dioxide ($SiO_2$) as an integral layer, with the tunnel oxide 8 having a thickness much less than that of the field oxide portions 4 and 6. The fabrication of the silicon substrate 2, the field oxide portions 4, 6 and the tunnel oxide 8 is conventional and known to a person skilled in the art.

The first polysilicon layer 10 is then formed on the field oxide 4, 6 and the tunnel oxide 8 by conventional deposition, patterning and etching, such as by using a conventional photoresist and a conventional etching process such as a plasma etch to remove portions of the first polysilicon layer from the surfaces of the field oxide portions 4 and 6 while retaining a portion 10 of the first polysilicon layer on the tunnel oxide 8. The first polysilicon layer on the tunnel oxide 8 serves as a floating gate 10 in the non-volatile memory. The process of depositing, patterning and etching the first polysilicon layer to form the floating gate 10 is conventional and known to a person skilled in the art.

Figure 2:
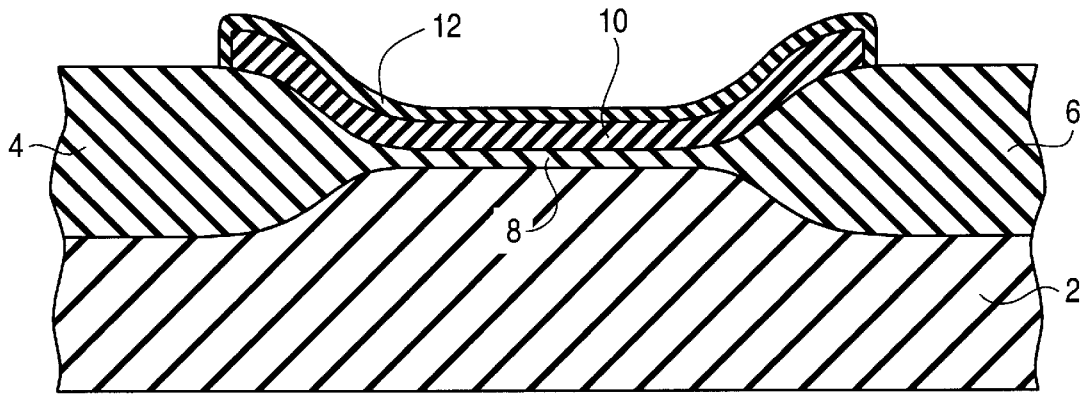
FIG. 2 is a sectional view of the non-volatile memory device of FIG. 1 with a nitride layer on the floating gate.

FIG. 2 is a sectional view of the non-volatile memory of FIG. 1 with a nitride layer 12 on the floating gate 10. The nitride layer 12 can be a thin layer formed on the surface of the floating gate 10 with a thickness typically much less than that of the first polysilicon layer 10. The nitride layer 12 may be less than 20 Å, and can be as thin as 10 Å.

In an embodiment, the nitride layer 12 is formed on the floating gate 10 by a vapor deposition, such as a chemical vapor deposition. With the chemical vapor deposition, the thickness of the nitride deposited on the floating gate 10 can be precisely controlled and distributed relatively evenly over the surface of the floating gate 10. Chemical vapor deposition may be desirable to produce a thin nitride layer with a thickness of 20 Å or less.

In another embodiment, the surface portion of the floating gate 10 may be nitridized by a nitridizing chemical such as ammonium ($NH_3$) to form the nitride layer 12. For example, the surface of the floating gate 10 can be nitridized with $NH_3$ in a plasma $NH_3$ ambient. In yet another embodiment, a layer of oxynitride may be deposited on the floating gate 10 as the nitride layer 12. The oxynitride layer 12 may be deposited on the floating gate 10 by using a chemical vapor deposition or a plasma deposition. The chemical vapor deposition may be desirable to produce a very thin oxynitride layer with a thickness of less than 20 Å, for example, on the order of about 10 Å.

After the deposition, the nitride layer 12 covering surfaces other than that of the floating gate may be removed by conventional etching techniques such as by using a patterned photoresist to cover the portion of the nitride layer 12 on the floating gate 10 and using a plasma etch to remove other portions of the nitride layer. Alternatively, subsequent depositions of additional interpolysilicon layers such as the high dielectric constant layer 14 may be performed on the nitride layer 12 before the nitride layer 12 and the subsequent layers are patterned with a photoresist and selectively removed by a plasma etch in a single etching step. Photoresist patterning and plasma etching are conventional and known to a person skilled in the art.

Figure 3:
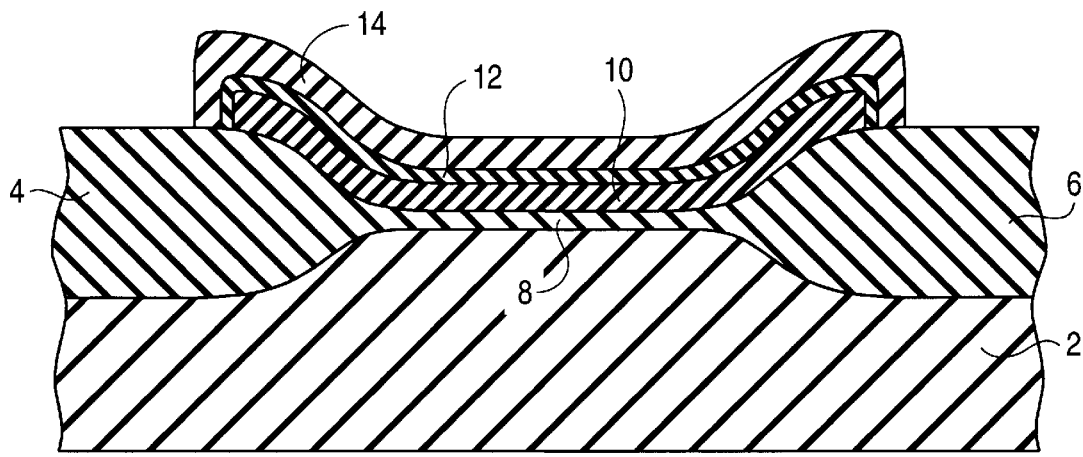
FIG. 3 is a sectional view of the non-volatile memory device of FIG. 2 with a high dielectric constant layer on the nitride layer.

FIG. 3 shows a sectional view of the non-volatile memory of FIG. 2 with a high dielectric constant layer 14 formed on the nitride layer 12. Examples of high dielectric constant materials suitable for application as the high dielectric constant layer 14 in the interpolysilicon dielectric structure include tantalum oxide ($Ta_2O_5$) and titanium oxide ($TiO_2$). Depending upon conditions under which the high dielectric constant layer 14 is formed and the material which is used for the high dielectric constant layer 14, the dielectric constant may range from about 20 to about 85, which is much larger than the dielectric constants of conventional oxide and nitride materials roughly in the range of about 3–8. Therefore, the capacitance resulting from the dielectric structure fabricated according to the method of the present invention can be several orders of magnitude greater than conventional oxide or nitride based interpolysilicon dielectric structures. Moreover, the high dielectric constant layer 14 can be relatively thick and still maintain a high capacitance, thereby allowing the low voltage non-volatile memory to be fabricated with a relatively high yield. For example, the high dielectric constant layer 14 may have a thickness in the range of about 300–400 Å.

The high dielectric constant layer 14 is then heated to remove the carbon content from the high dielectric constant layer 14. For example, the high dielectric constant layer 14 may be annealed in a nitrogen oxide ambient to combust the carbon out of the high dielectric constant layer 14. High dielectric constant materials such as $TiO_2$ and $Ta_2O_5$ may be provided in organic forms that may have carbon contents. For example, tantalum oxide, which has a formula of $Ta_2O_5$ in its pure form, may be deposited as an organic precursor $Ta(OC_2H_5)_5$, which has a significant residual carbon content, on the nitride layer 12. The carbon in the organic compound is removed by the annealing of the high dielectric constant layer 14 in a nitrogen oxide ambient. The nitrogen oxide ambient gas may be either $N_2O$ or NO. The annealing of the high dielectric constant layer 14 in the nitrogen oxide ambient forms a layer of nitrogen-rich oxide on the high dielectric constant layer 14.

In conventional high dielectric constant material processing, the material is oxidized to combust the carbon content out of the organic material which has been deposited on the first polysilicon layer. In general, the oxidation of the high dielectric constant material can grow a thick oxide of as much as 40 Å on the first interpolysilicon layer. In the present invention, the first polysilicon layer or the floating gate 10 is covered by a thin nitride 12 to retard the oxidation of the floating gate 10 before the high dielectric constant material 14 is deposited and annealed to remove its carbon content. In general, a thickness of only 20 Å or less is needed for the nitride layer 12 to retard the oxidation of the first polysilicon layer 10 when the high dielectric constant material 14 is annealed.

Figure 4:
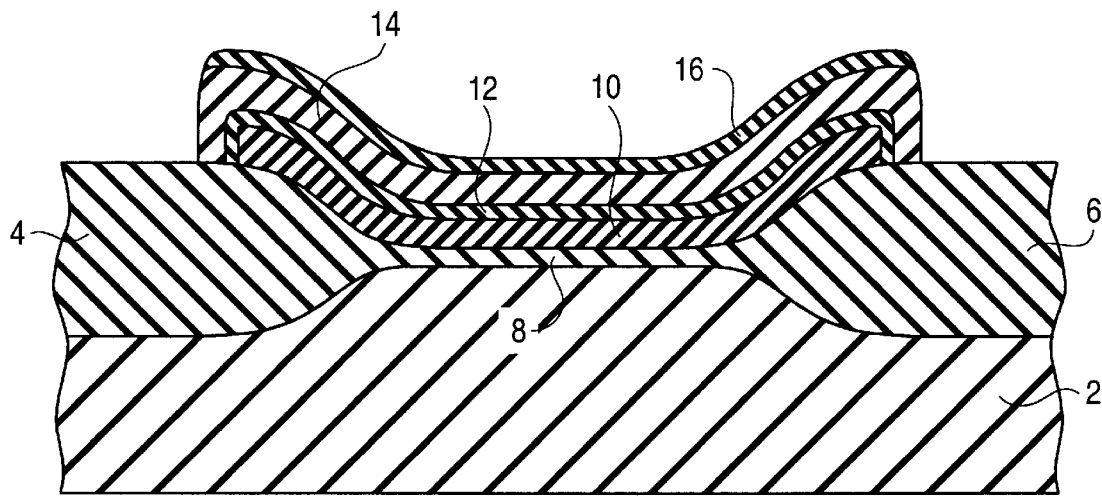
FIG. 4 is a sectional view of the non-volatile memory device of FIG. 3 with an oxide or oxynitride layer on the high dielectric constant layer.

FIG. 4 shows a sectional view of the non-volatile memory of FIG. 3 with an optional layer 16 of an oxide or an oxynitride on the high dielectric constant layer 14. The oxide or oxynitride layer 16 may be deposited and etched by conventional processing methods known to a person skilled in the art. For example, a chemical vapor deposition of an oxynitride material may be performed to deposit a thin oxynitride layer 16 of 10 Å or less on the high dielectric constant layer 14. However, the deposition of the oxide or oxynitride layer 16 is not critical to the present invention.

Figure 5:
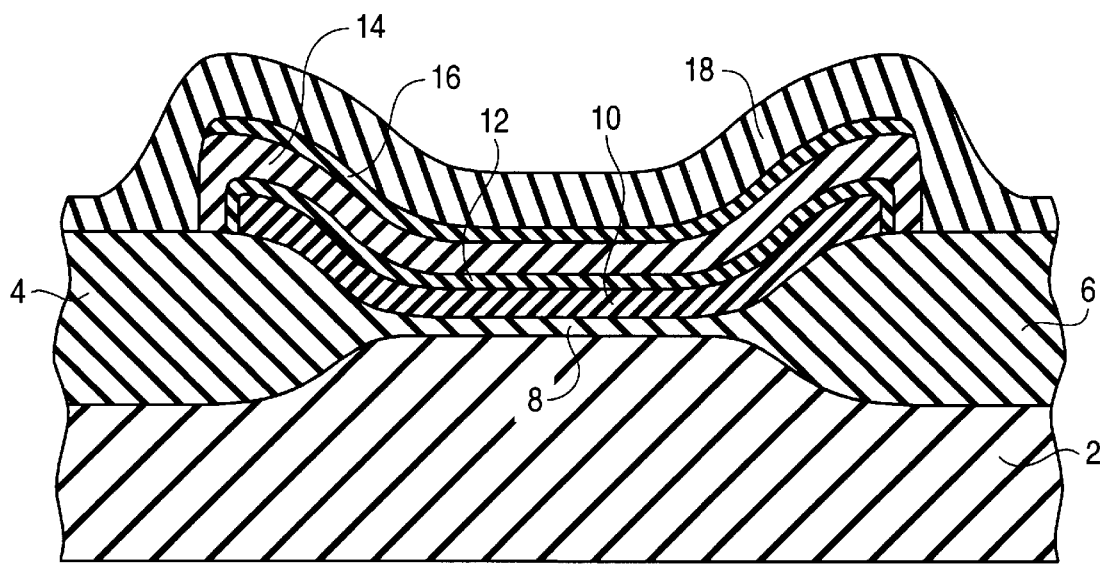
FIG. 5 is a sectional view of the non-volatile memory device of FIG. 4 with a second polysilicon layer deposited on the oxide or oxynitride layer.
Figure 6:
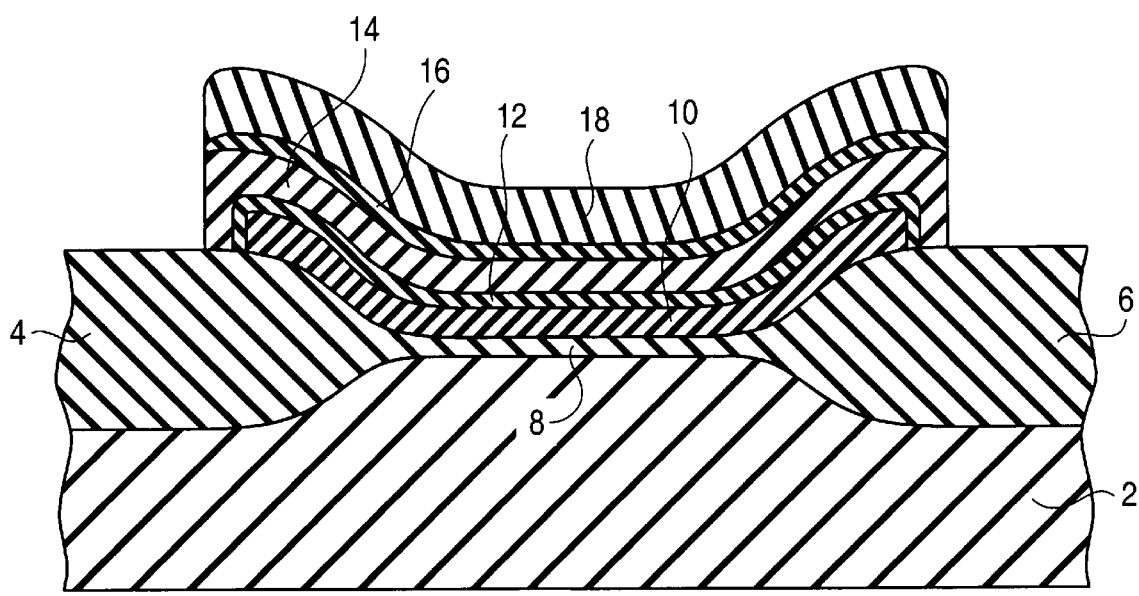
FIG. 6 is a sectional view of the non-volatile memory device of FIG. 5 with portions of the second polysilicon layer etched to form a control gate on the oxide or oxynitride layer.

As shown in FIG. 5, a second polysilicon layer 18 is deposited on the oxide or oxynitride layer 16 and the field oxide portions 4 and 6. The portion of the second polysilicon layer covering the field oxide portions 4 and 6 are removed by conventional etching methods such as plasma etching to form a control gate 18 on the oxide or oxynitride layer 16, as shown in FIG. 6. Alternatively, the second polysilicon layer may be deposited and etched to form a control gate 18 directly on the high dielectric constant layer 14 if the thin oxide or oxynitride layer 16 has not been provided on the high dielectric constant layer 14.

An advantage of forming a thin nitride layer 12 between the floating gate 10 and the high dielectric constant layer 14 is that it is able to retard the oxidation of the floating gate 10 when the carbon is removed from the high dielectric constant layer 14 by annealing it in a nitrogen oxide ambient. A further advantage of the present invention is that the carbon content in the high dielectric constant layer can be removed without growing an appreciable oxide layer in the floating gate, thereby avoiding a decrease in the capacitance and hence the coupling ratio of the dual gate memory device.

INDUSTRIAL APPLICABILITY

The method according to the present invention is applicable for the fabrication of non-volatile dual memory devices including flash electronically erasable programmable read-only memory (EEPROM) devices and for the fabrication of other logic gate dielectric structures. The method is believed to be superior to conventional processing methods which typically produce interpolysilicon dielectric structures with a coupling ratio of about 50%, which usually necessitates an operating voltage of about 19–20 volts at the control gate. The method according to the present invention is expected to produce a dielectric structure resulting in a relatively high capacitance between the floating gate and the control gate, thus increasing the coupling ratio to 90% or above to enable the memory device to operate at a reduced program or erase voltage in the range of about 10–12 volts. Moreover, the great increase in the dielectric constant allows the dielectric structure to be much thicker while maintaining a high capacitance, thereby enabling the memory device to be fabricated with a high yield.

The invention has been described with respect to particular embodiments thereof, and numerous modifications can be made which are within the scope of the invention as set forth in the claims.

What is claimed is:

1. A method of fabricating a dielectric structure in a non-volatile memory, comprising the steps of:
   (A) providing a first polysilicon layer;
   (B) forming a nitride layer on the first polysilicon layer;
   (C) forming a high dielectric constant layer on the nitride layer; and
   (D) forming a nitrogen-rich oxide layer on the high dielectric constant layer.

2. A method of fabricating a dielectric structure in a non-volatile memory, comprising the steps of:
   (I) providing a floating gate;
   (II) depositing a nitride layer on the floating gate;
   (III) forming a high dielectric constant layer on the nitride layer; and
   (IV) forming a nitrogen-rich oxide layer on the high dielectric constant layer.

3. A method of fabricating a dielectric structure in a non-volatile memory, comprising the steps of:
   (I) providing a floating gate;
   (II) nitridizing the floating gate to form a nitride layer on the floating gate;
   (III) forming a high dielectric constant layer on the nitride layer; and
   (IV) forming a nitrogen-rich oxide layer on the high dielectric constant layer.

4. A method of fabricating a dielectric structure in a non-volatile memory, comprising the steps of:
   (I) providing a floating gate;
   (II) depositing a first oxynitride layer on the floating gate;
   (III) forming a high dielectric constant layer on the first oxynitride layer; and
   (IV) forming a nitrogen-rich oxide layer on the high dielectric constant layer.

5. A method of fabricating a dielectric structure in a non-volatile memory that includes a substrate, a tunnel oxide on the substrate and a floating gate on the tunnel oxide, comprising the steps of:
   (I) forming a nitride layer on the floating gate;
   (II) forming a high dielectric constant layer on the nitride layer;
   (III) forming a nitrogen rich oxide layer on the high dielectric constant layer; and
   (IV) forming a control gate on the nitrogen rich oxide layer.

6. The method of claim 1, wherein the step of providing the first polysilicon layer comprises the step of providing a floating gate.

7. The method of claim 1, wherein the step of forming the nitride layer comprises the step of depositing a nitride layer on the first polysilicon layer.

8. The method of claim 7, wherein the step of depositing the nitride layer on the first polysilicon layer comprises the step of chemical vapor depositing the nitride layer on the first polysilicon layer.

9. The method of claim 1, wherein the step of forming the nitride layer comprises the step of nitridizing the first polysilicon layer.

10. The method of claim 9, wherein the step of nitridizing the first polysilicon layer comprises the step of nitridizing the first polysilicon layer with $NH_3$.

11. The method of claim 10, wherein the step of nitridizing the first polysilicon layer with $NH_3$ comprises the step of nitridizing the first polysilicon layer in a plasma $NH_3$ ambient.

12. The method of claim 1, wherein the step of forming the nitride layer comprises the step of depositing an oxynitride layer on the first polysilicon layer.

13. The method of claim 1, further comprising the step of heating the high dielectric constant layer.

14. The method of claim 13, wherein the step of heating the high dielectric constant layer comprises the step of annealing the high dielectric constant layer.

15. The method of claim 1, wherein the step of forming the nitrogen-rich oxide layer comprises the step of heating the high dielectric constant layer in a nitrogen oxide ambient.

16. The method of claim 15, wherein the nitrogen oxide ambient comprises $N_2O$.

17. The method of claim 15, wherein the nitrogen oxide ambient comprises NO.

18. The method of claim 15, wherein the step of heating the high dielectric constant layer comprises the step of annealing the high dielectric constant layer.

19. The method of claim 1, wherein the step of forming the high dielectric constant layer comprises the step of depositing the high dielectric constant layer on the nitride layer.

20. The method of claim 1, wherein the high dielectric constant layer comprises $Ta_2O_5$.

21. The method of claim 1, wherein the high dielectric constant layer comprises $TiO_2$.

22. The method of claim 1, wherein the step of depositing the nitrogen-rich oxide layer comprises the step of depositing an oxynitride layer on the high dielectric constant layer.

23. The method of claim 1, further comprising the step of forming a second polysilicon layer on the nitrogen-rich oxide layer.

24. The method of claim 2, wherein the step of depositing the nitride layer on the floating gate comprises the step of chemical vapor depositing the nitride layer on the floating gate.

25. The method of claim 2, further comprising the step of heating the high dielectric constant layer.

26. The method of claim 25, wherein the step of heating the high dielectric constant layer comprises the step of annealing the high dielectric constant layer.

27. The method of claim 2, wherein the step of forming the nitrogen-rich oxide layer comprises the step of heating the high dielectric constant layer in a nitrogen oxide ambient.

28. The method of claim 27, wherein the nitrogen oxide ambient comprises $N_2O$.

29. The method of claim 27, wherein the nitrogen oxide ambient comprises NO.

30. The method of claim 27, wherein the step of heating the high dielectric constant layer comprises the step of annealing the high dielectric constant layer.

31. The method of claim 2, wherein the step of forming the high dielectric constant layer comprises the step of depositing the high dielectric constant layer on the nitride layer.

32. The method of claim 2, wherein the high dielectric constant layer comprises $TA_2O_5$.

33. The method of claim 2, wherein the high dielectric constant layer comprises $TiO_2$.

34. The method of claim 2, wherein the step of depositing the nitrogen-rich oxide layer comprises the step of depositing an oxynitride layer on the high dielectric constant layer.

35. The method of claim 2, further comprising the step of providing a control gate on the nitrogen-rich oxide layer.

36. The method of claim 3, wherein the step of nitridizing the floating gate comprises the step of nitridizing the floating gate with $NH_3$.

37. The method of claim 3, wherein the step of nitridizing the floating gate with $NH_3$ comprises the step of nitridizing the floating gate in a plasma $NH_3$ ambient.

38. The method of claim 3, further comprising the step of heating the high dielectric constant layer.

39. The method of claim 38, wherein the step of heating the high dielectric constant layer comprises the step of annealing the high dielectric constant layer.

40. The method of claim 3, wherein the step of forming the nitrogen-rich oxide layer comprises the step of heating the high dielectric constant layer in a nitrogen oxide ambient.

41. The method of claim 40, wherein the nitrogen oxide ambient comprises $N_2O$.

42. The method of claim 40, wherein the nitrogen oxide ambient comprises NO.

43. The method of claim 40, wherein the step of heating the high dielectric constant layer comprises the step of annealing the high dielectric constant layer.

44. The method of claim 3, wherein the step of forming the high dielectric constant layer comprises the step of depositing the high dielectric constant layer on the nitride layer.

45. The method of claim 3, wherein the high dielectric constant layer comprises $Ta_2O_5$.

46. The method of claim 3, wherein the high dielectric constant layer comprises $TiO_2$.

47. The method of claim 3, wherein the step of depositing the nitrogen-rich oxide layer comprises the step of depositing an oxynitride layer on the high dielectric constant layer.

48. The method of claim 3, further comprising the step of providing a control gate on the nitrogen-rich oxide layer.

49. The method of claim 4, further comprising the step of heating the high dielectric constant layer.

50. The method of claim 49, wherein the step of heating the high dielectric constant layer comprises the step of annealing the high dielectric constant layer.

51. The method of claim 4, wherein the step of forming the nitrogen-rich oxide layer comprise the step of heating the high dielectric constant layer in a nitrogen oxide ambient.

52. The method of claim 51, wherein the nitrogen oxide ambient comprises $N_2O$.

53. The method of claim 51, wherein the nitrogen oxide ambient comprises NO.

54. The method of claim 51, wherein the step of heating the high dielectric constant layer comprises the step of annealing the high dielectric constant layer.

55. The method of claim 4, wherein the step of forming the high dielectric constant layer comprises the step of depositing the high dielectric constant layer on the first oxynitride layer.

56. The method of claim 4, wherein the high dielectric constant layer comprises $Ta_2O_5$.

57. The method of claim 4, wherein the high dielectric constant layer comprises $TiO_2$.

58. The method of claim 4, wherein the step of depositing the nitrogen-rich oxide layer comprises the step of depositing a second oxynitride layer on the high dielectric constant layer.

59. The method of claim 4, further comprising the step of providing a control gate on the nitrogen-rich oxide layer.

60. The method of claim 5, wherein the step of providing the floating gate comprises the step of forming a floating gate.

61. The method of claim 5, wherein the step of forming the nitride layer comprises the step of depositing a nitride layer on the floating gate.

62. The method of claim 61, wherein the step of depositing the nitride layer on the floating gate comprises the step of chemical vapor depositing the nitride layer on the floating gate.

63. The method of claim 5, wherein the step of forming the nitride layer comprises the step of nitridizing the floating gate.

64. The method of claim 63, wherein the step of nitridizing the floating gate comprises the step of nitridizing the floating gate with $NH_3$.

65. The method of claim 64, wherein the step of nitridizing the floating gate with $NH_3$ comprises the step of nitridizing the floating gate in a plasma $NH_3$ ambient.

66. The method claim 5, wherein the step of forming the nitride layer comprises the step of depositing an oxynitride layer on the floating gate.

67. The method claim 5, further comprising the step of heating the high dielectric constant layer.

68. The method of claim 67, wherein the step of heating the high dielectric constant layer comprises the step of annealing the high dielectric constant layer.

69. The method of claim 5, wherein the step of forming the nitrogen-rich oxide layer comprises the step of heating the high dielectric constant layer in a nitrogen oxide ambient.

70. The method of claim 69, wherein the nitrogen oxide ambient comprises $N_2O$.

71. The method of claim 69, wherein the nitrogen oxide ambient comprises NO.

72. The method of claim 69, wherein the step of heating the high dielectric constant layer comprises the step of annealing the high dielectric constant layer.

73. The method of claim 5, wherein the step of forming the high dielectric constant layer comprises the step of depositing the high dielectric constant layer on the nitride layer.

74. The method of claim 5, wherein the high dielectric constant layer comprises $TA_2O_5$.

75. The method of claim 5, wherein the high dielectric constant layer comprises $TiO_2$.

76. The method of claim 5, wherein the step of depositing the nitrogen-rich oxide layer comprises the step of depositing an oxynitride layer on the high dielectiric constant layer.

* * * * *